United States Patent
Hayashi

(10) Patent No.: US 12,085,850 B2
(45) Date of Patent: Sep. 10, 2024

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Tatsuya Hayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 295 days.

(21) Appl. No.: 16/864,201

(22) Filed: May 1, 2020

(65) Prior Publication Data
US 2020/0363715 A1 Nov. 19, 2020

(30) Foreign Application Priority Data

May 14, 2019 (JP) .................................. 2019-091617

(51) Int. Cl.
*G03F 7/00* (2006.01)
(52) U.S. Cl.
CPC .................................. *G03F 7/0002* (2013.01)
(58) Field of Classification Search
CPC ............................. G03F 7/70775; G03F 7/0002
See application file for complete search history.

(56) References Cited

U.S. PATENT DOCUMENTS

| 7,298,456 B2 | 11/2007 | Cherala |
| 8,765,034 B2 | 7/2014 | Takakuwa |
| 8,907,346 B2 | 12/2014 | Koshiba |
| 2014/0320842 A1* | 10/2014 | Sato ...................... G03F 7/0002 355/77 |
| 2016/0299444 A1* | 10/2016 | Komaki ................ G03F 9/7042 |

FOREIGN PATENT DOCUMENTS

| JP | 2008504141 A | 2/2008 | |
| JP | 2014053333 A | 3/2014 | |
| JP | 2014053495 A | 3/2014 | |
| JP | 2016103603 A * | 6/2016 | |
| JP | 2016143838 A | 8/2016 | |
| JP | 2017135369 A | 8/2017 | |
| JP | 2018056533 A * | 4/2018 | ........... G03F 7/0002 |
| WO | 2005121892 A2 | 12/2005 | |
| WO | WO-2017038026 A1 * | 3/2017 | ............. B29C 33/42 |

\* cited by examiner

*Primary Examiner* — Emmanuel S Luk
*Assistant Examiner* — Victoria Bartlett
(74) *Attorney, Agent, or Firm* — ROSSI, KIMMS & McDOWELL LLP

(57) ABSTRACT

Imprint apparatus forms pattern of imprint material by contacting pattern region of mold with the imprint material and curing the imprint material. The apparatus includes actuators for controlling shape of the pattern region by applying force to the mold and controller for controlling the actuators. Each actuator is given command value defined by sum of first command value for correcting first component, of shape difference between the shot region and the pattern region, that can be approximated by linear function and second command value for correcting second component, of the shape difference, that can be approximated by second- or higher-order function. After determining the first command value, the controller determines adjustment range of the second command value based on the first command value and determines the second command value by setting the adjustment range as restriction.

6 Claims, 9 Drawing Sheets

IMPRINT APPARATUS, IMPRINT METHOD, AND ARTICLE MANUFACTURING METHOD

BACKGROUND OF THE INVENTION

Field of the Invention

The present invention relates to an imprint apparatus, an imprint method, and an article manufacturing method.

Description of the Related Art

In an imprint apparatus, a pattern region of a mold is brought into contact with an imprint material on a shot region of a substrate, and the imprint material is cured, thereby forming a pattern made of a cured product of the imprint material. As a technique of matching the shape of the pattern region of the mold with the shape of the shot region of the substrate, there is provided a technique of deforming the pattern region by applying a force to the side surfaces of the mold (Japanese Patent Laid-Open No. 2008-504141). A deformation mechanism of deforming the pattern region can include a plurality of actuators for applying a force to the side surfaces of the mold.

A shape difference between the shot region of the substrate and the pattern region of the mold can include a first-order component such as a magnification component, a rotation component, or a rhombic component, and a second- or higher-order component. A command value to be given to each actuator of the deformation mechanism can be given by a sum of the first command value for correcting the first-order component and the second command value for correcting the second- or higher-order component. In one example, it is considered to assign, to the first command value, 50% of the maximum range of the command value that can be given to the actuator, and to assign the remaining 50% of the maximum range to the second command value. In this case, however, for example, if the first command value calculated from the shape difference is 70% of the maximum range, the first command value that can be given to the actuator is short by 20%, and it is thus impossible to correct the shape difference accurately. That is, if the first command value calculated from the shape difference exceeds the range assigned to the first command value, it is impossible to correct the shape difference accurately.

SUMMARY OF THE INVENTION

The present invention provides a technique advantageous in correcting a shape difference between a shot region of a substrate and a pattern region of a mold.

One of aspect of the present invention provides an imprint apparatus for forming a pattern made of a cured product of an imprint material by bringing a pattern region of a mold into contact with the imprint material on a shot region of a substrate and curing the imprint material, comprising: a plurality of actuators configured to control a shape of the pattern region by applying a force to the mold; and a controller configured to control the plurality of actuators, wherein each of the plurality of actuators is given a command value defined by a sum of a first command value for correcting a first component, of a shape difference between the shot region and the pattern region, that can be approximated by a linear function and a second command value for correcting a second component, of the shape difference, that can be approximated by a second- or higher-order function, and for each of the plurality of actuators, after determining the first command value, the controller determines an adjustment range of the second command value based on the determined first command value, and determines the second command value by setting the adjustment range as a restriction.

Further features of the present invention will become apparent from the following description of exemplary embodiments with reference to the attached drawings.

DESCRIPTION OF THE EMBODIMENTS

Figure 1:
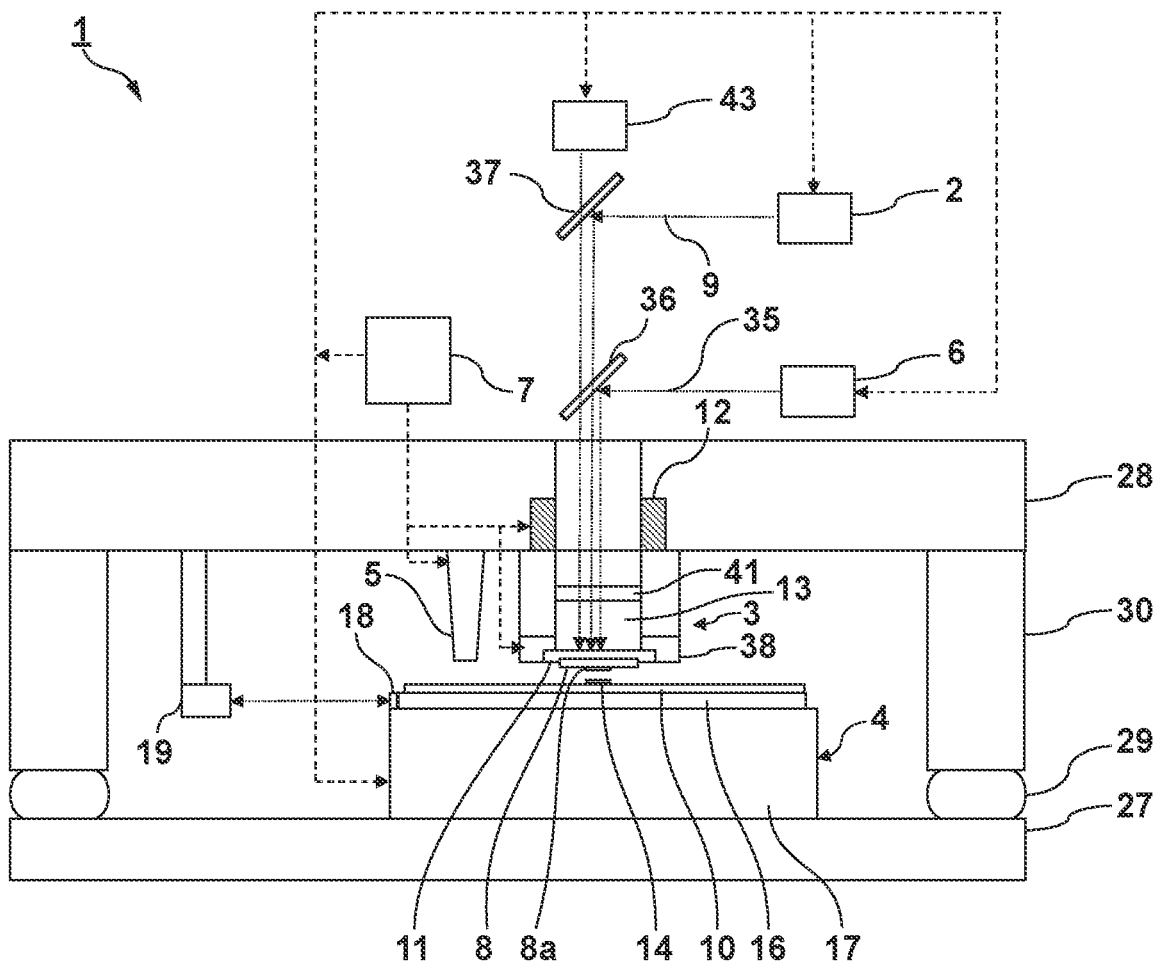
FIG. 1 is a view showing the arrangement of an imprint apparatus according to an embodiment of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 shows the arrangement of an imprint apparatus 1 according to an embodiment. The imprint apparatus 1 cures an imprint material 14 arranged on a shot region of a substrate 10 by bringing a pattern region 8a of a mold 8 into contact with the imprint material 14, thereby forming a pattern made of a cured product of the imprint material 14. As the imprint material, a curable composition (to be also referred to a resin in an uncured state hereinafter) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

In the specification and the accompanying drawings, directions will be indicated on an XYZ coordinate system in which directions parallel to the surface of the substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation. Alignment (positioning) can include controlling the position and/or orientation of at least one of the substrate and the mold such that the alignment error (overlay error) between the shot region of the substrate and the pattern region of the mold decreases. In addition, alignment can include control to correct or change the shape of at least one of the shot region of the substrate and the pattern region of the mold.

The imprint apparatus 1 can be used to manufacture an article such as a semiconductor device. The imprint apparatus 1 configured to use light as curing energy will be described below. However, the imprint apparatus 1 can use another curing energy, as described above. The imprint apparatus 1 can include a light irradiator (curing unit) 2, a mold operation mechanism 3, a substrate operation mechanism 4, a dispenser (supplier) 5, a mold deformation mechanism 38, a substrate heater 43, an alignment measurement equipment 6, and a controller 7. The light irradiator 2 irradiates the imprint material 14 with curing light (for example, ultraviolet light) 9 as curing energy that cures the imprint material 14 in a state in which the imprint material 14 on the shot region of the substrate 10 is in contact with the pattern region 8a of the mold 8. This cures the imprint material 14, thereby forming a pattern made of a cured product of the imprint material 14 on the shot region. The light irradiator 2 can include, for example, a light source and an optical element that adjusts light emitted from the light source. The imprint material 14 on the substrate 10 can be irradiated with the curing light 9 that is reflected by, for example, a dichroic mirror 37 and passes through the mold 8.

The mold 8 has, for example, a rectangular peripheral shape, and includes, on its surface facing the substrate 10, the pattern region 8a on which a pattern such as a circuit pattern is formed. The pattern can be formed by a concave portion. The mold 8 can be made of a material that can transmit the curing light 9, for example, quartz. To make it easy to deform the pattern region 8a by the mold deformation mechanism 38, the mold 8 can include, on a surface opposite to the surface on which the pattern region 8a is provided, a cavity that has a circular shape on a plane parallel to the X-Y plane and has a certain depth in the Z-axis direction.

The mold operation mechanism 3 can include a mold holder 11 that holds the mold 8, and a mold driving mechanism 12 that holds the mold holder 11 and drives the mold 8 in the Z-axis direction. The mold holder 11 can hold the mold 8 by attracting a region outside the irradiation region of the curing light 9 on the mold 8 by a chucking force such as a vacuum suction force or an electrostatic force. For example, when the mold holder 11 holds the mold 8 by the vacuum suction force, the mold holder 11 is connected to a vacuum pump (not shown) via a connection line, and attaching/detaching of the mold 8 can be switched by turning on/off the vacuum pump or using a valve provided in the connection line.

The mold holder 11 and the mold driving mechanism 12 can include an opening region 13 in the center (inside) so that the curing light 9 emitted from the light irradiator 2 travels toward the substrate 10. In the opening region 13, a light transmitting member 41 (for example, a quartz plate) having a pressure control space enclosed with the mold 8 and a part of the opening region 13 as a sealed space can be arranged, and a pressure adjustment apparatus (not shown) including a pressure source can adjust the pressure of the pressure control space. The pressure adjustment apparatus can be configured to, for example, warp the pattern region 8a into a convex shape toward the substrate 10 by setting the pressure of the pressure control space to be higher than that of an external space when the mold 8 is pressed against the imprint material 14 on the substrate 10. This can bring the pattern region 8a into contact with the imprint material 14 from the center of the pattern region 8a. This is advantageous in restraining a gas from remaining between the pattern region 8a and the imprint material 14, and accelerating filling of the concave portion of the pattern region 8a with the imprint material 14.

The mold driving mechanism 12 can drive the mold 8 in the Z-axis direction to perform an operation of bringing the pattern region 8a of the mold 8 into contact with the imprint material 14 on the substrate 10 and an operation of separating the mold 8 from the cured product of the imprint material 14. The mold driving mechanism 12 can include, for example, a voice coil motor and/or an air cylinder as an actuator for driving the mold 8. To cope with accurate positioning of the mold 8, the mold driving mechanism 12 may be formed by a plurality of driving systems such as a coarse driving system and a fine driving system. Furthermore, the mold driving mechanism 12 may perform driving of the mold 8 concerning not only the Z-axis direction but also at least one of the X-axis direction, the Y-axis direction, the θZ-axis, the θX-axis, and the θY-axis.

The operation of bringing the pattern region 8a of the mold 8 into contact with the imprint material 14 on the substrate 10 and the operation of separating the mold 8 from the cured product of the imprint material 14 may be performed by driving the substrate 10 in the Z-axis direction by the substrate operation mechanism 4. Alternatively, these operations may be performed by both the mold driving mechanism 12 and the substrate operation mechanism 4.

The alignment measurement equipment 6 can execute processing for measuring the relative position between a mark provided on the mold 8 and a mark provided on the substrate 10. The controller 7 can specify the relative position between the pattern region 8a of the mold 8 and the shot region of the substrate 10 based on an output from the alignment measurement equipment 6. In one example, alignment light 35 emitted from the alignment measurement equipment 6 is reflected by a dichroic mirror 36, and the mark provided on the mold 8 and the mark provided on the substrate 10 are illuminated with the light. The alignment light 35 reflected by these marks forms an optical image on the imaging plane of the image sensor of the alignment measurement equipment 6, and the optical image can be captured by the image sensor. The alignment measurement equipment 6 can output, to the controller 7, image data obtained by image capturing. Alternatively, the alignment measurement equipment 6 may process the image data obtained by image capturing to detect the relative position between the mark provided on the mold 8 and the mark provided on the substrate 10, thereby outputting a result to the controller 7.

The substrate 10 is, for example, a substrate such as a silicon substrate. The substrate operation mechanism 4 can include a substrate holder 16 that holds the substrate 10, and a substrate driving mechanism 17 that drives the substrate 10 by driving the substrate holder 16. The substrate holder 16 can hold the substrate 10 with, for example, a chucking force such as a vacuum suction force or an electrostatic force. The substrate driving mechanism 17 can drive, for example, the substrate holder 16 in the X direction and the Y direction. The substrate driving mechanism 17 can include a linear motor or a plane pulse motor as an actuator that drives the substrate holder 16. The substrate driving mechanism 17 may be formed by a plurality of driving systems such as a coarse driving system and a fine driving system. Furthermore, the substrate driving mechanism 17 may perform driving of the substrate 10 concerning at least one of the Z-axis direction, the θZ-axis, the θX-axis, and the θY-axis. The substrate holder 16 can be provided with a reference mirror 18 for measuring the position and orientation of the substrate holder 16, and the imprint apparatus 1 can be provided with a laser interferometer 19 for measuring the position and orientation of the substrate holder 16 using the reference mirror 18. Alternatively, the imprint apparatus 1 may include an encoder with an encoder scale and a reader that reads the encoder scale in order to measure the position and orientation of the substrate holder 16. The controller 7 can control the substrate driving mechanism 17 based on the measured position and orientation of the substrate holder 16.

The dispenser 5 can be arranged in, for example, the periphery of the mold operation mechanism 3. The dispenser 5 can supply or arrange the imprint material 14 on the shot region of the substrate 10. An amount of the imprint material 14 supplied onto the shot region can be determined in accordance with, for example, the thickness of a pattern to be formed by the imprint material 14 on the substrate 10, the density of the pattern, and the like.

The controller 7 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer embedded with a program, or a combination of all or some of these components. The controller 7 can control the constituent elements of the imprint apparatus 1, for example, the light irradiator 2, the mold operation mechanism 3, the substrate operation mechanism 4, the dispenser 5, the mold deformation mechanism 38, the substrate heater 43, and the alignment measurement equipment 6.

The imprint apparatus 1 can further include a base surface plate 27 that supports the substrate operation mechanism 4, a bridge surface plate 28 that supports the mold operation mechanism 3, and columns 30 that are extended from the base surface plate 27 to support the bridge surface plate 28 via antivibrators 29. The antivibrators 29 remove a vibration transferred from a floor surface to the bridge surface plate 28. In addition, the imprint apparatus 1 can include a mold conveyance mechanism that conveys the mold 8 to the mold holder 11 and a substrate conveyance mechanism that conveys the substrate 10 to the substrate operation mechanism 4.

Figure 2:
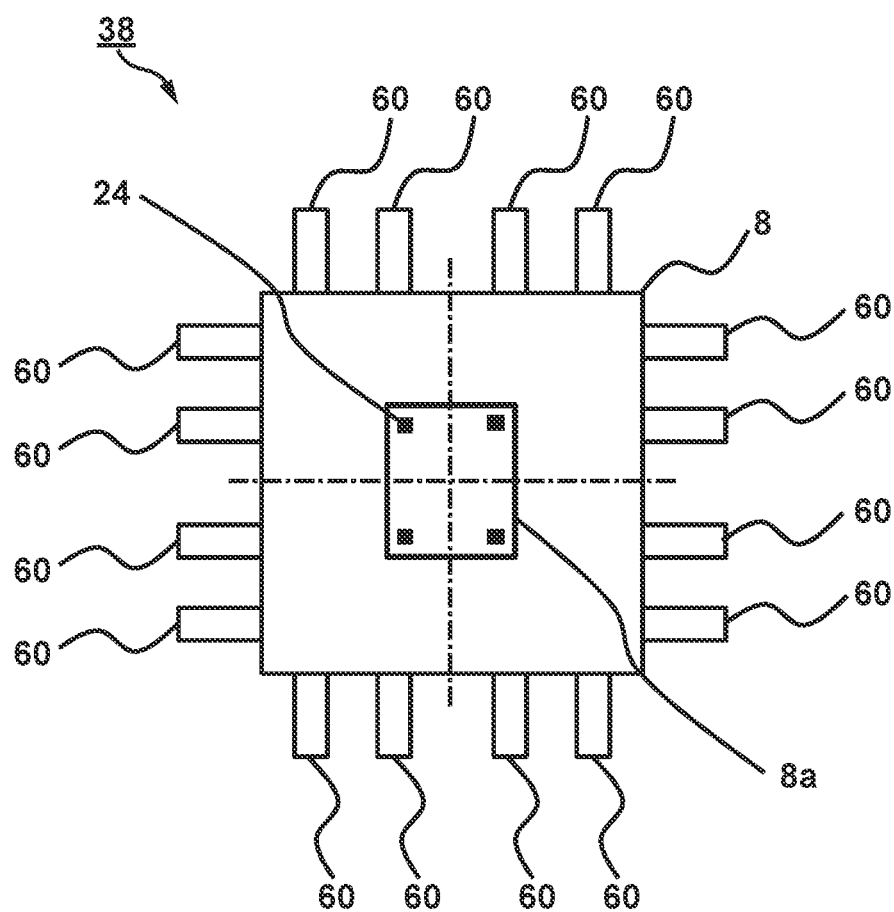
FIG. 2 is a view showing an example of the arrangement of a mold deformation mechanism.

FIG. 2 shows an example of the arrangement of the mold deformation mechanism 38. The mold deformation mechanism 38 can include a plurality of actuators 60 that control the shape of the pattern region 8a of the mold 8 by applying a force to the side surfaces of the mold 8. The mold 8 includes marks 24, and the marks 24 can typically be arranged in the pattern region 8a. Each actuator 60 can have an arrangement that can apply a force to the mold 8 in a direction in which the mold 8 is pressed but cannot apply a force to the mold 8 in a direction in which the mold 8 is pulled. In this case, the pattern region 8a of the mold 8 can be made to have ideal dimensions by creating the pattern region 8a in dimensions larger than the ideal dimensions by about several ppm, and reducing the pattern region 8a at a predetermined ratio. This can contract or expand the pattern region 8a with respect to the ideal dimensions, thereby correcting the shape of the pattern region 8a to an arbitrary shape.

Figure 3:
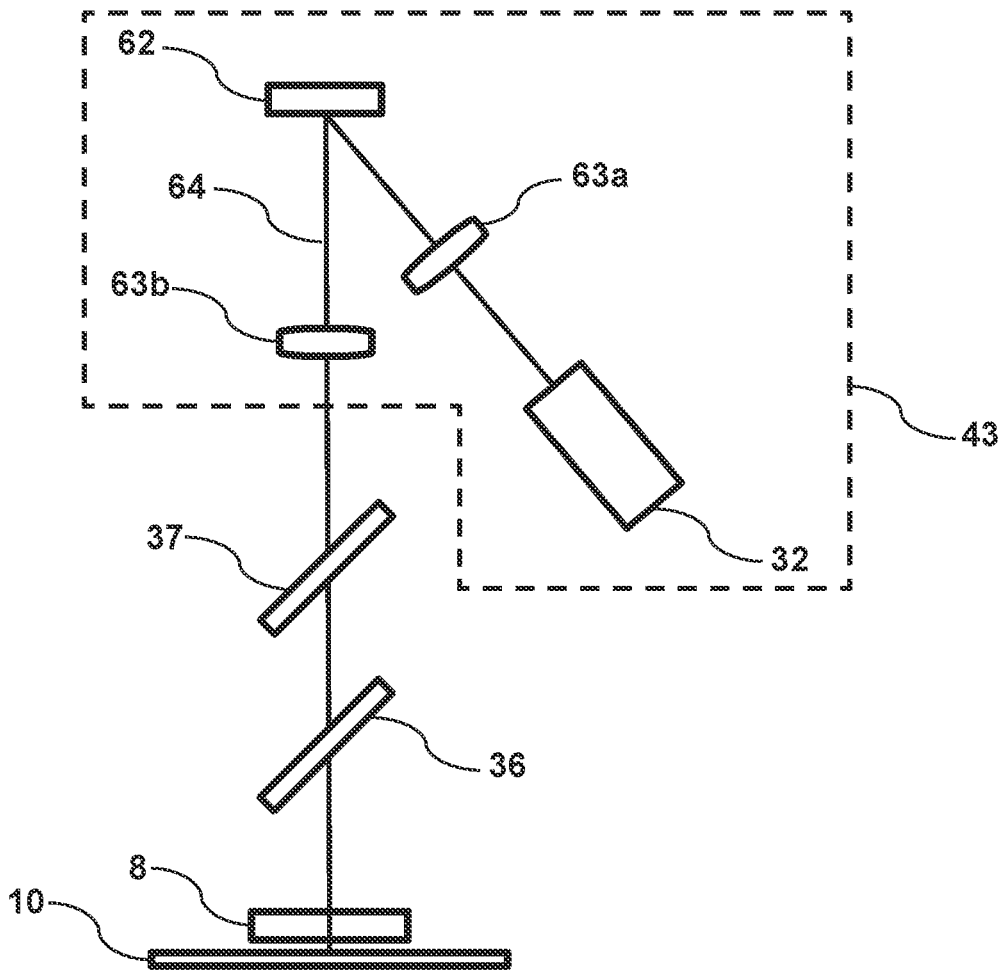
FIG. 3 is a view showing an example of the arrangement of a substrate heater.

FIG. 3 shows an example of the arrangement of the substrate heater 43. The substrate heater 43 can include, for example, a laser source 32 as a heat source. A laser beam 64 emitted from the laser source 32 is light in a wavelength range that does not cure the imprint material 14 and is transmitted through the mold 8 and the substrate 10, and can be, for example, visible light or infrared light. The in-plane illuminance of the laser beam 64 emitted from the laser source 32 can be made uniform by an optical element 63a, and a light modulation element 62 can be irradiated with the laser beam 64. The light modulation element 62 can be, for example, a digital micromirror device. The laser beam 64 with which the light modulation element 62 is irradiated is provided with an arbitrary illuminance distribution by the light modulation element 62. The laser beam 64 provided with an arbitrary illuminance distribution by the light modulation element 62 is adjusted by an optical element 63b in terms of a magnification on the irradiation surface of the laser beam 64, and the dichroic mirror 37 is irradiated with the laser beam 64. After that, the laser beam 64 is transmitted through the mold 8, and the substrate 10 is irradiated with the laser beam 64 to absorb it. A film that readily absorbs the laser beam 64 may be provided on the surface of the substrate 10, which is irradiated with the laser beam 64.

A method of improving the overlay accuracy by reducing the shape difference between the pattern region 8a of the mold 8 and the shot region of the substrate 10 using the mold deformation mechanism 38 and the substrate heater 43 will be described. The shape difference includes first-order components (linear components) such as a magnification component and a rhombic component each of which can be approximated by a linear function, and second- or higher-order components (high-order components) each of which can be approximated by a second- or higher-order function. For example, functions representing shape differences $T_x$ and $T_y$ in the X direction and the Y direction can be given as functions of coordinates (x, y) by:

$$T_x = k_1 + k_3 x - k_5 y + k_7 x^2 + k_9 xy + k_{11} y^2 \quad (1)$$

$$T_y = k_2 + k_4 y + k_6 x + k_8 y^2 + k_{10} xy + k_{12} x^2 \quad (2)$$

where $k_1$ and $k_2$ represent shift components. The shift components $k_1$ and $k_2$ can be set to 0 by performing alignment between the substrate 10 and the mold 8 by the substrate operation mechanism 4 and/or the mold operation mechanism 3. $k_3$, $k_4$, $k_5$, and $k_6$ represent first-order components each of which can be approximated by a linear function. $k_3$ and $k_4$ represent magnification components, $k_5$ and $k_6$ represent a rotation component and a rhombic component, respectively. $k_7$ and subsequent components are second- or higher-order components (high-order components) each of which can be approximated by a second- or higher-order function. The shape differences between the shot region of the substrate 10 and the pattern region 8a of the mold 8 may cause an overlay error between the pattern on the shot region and the pattern on the pattern region 8a. The shape differences can be specified by measuring the relative position between the mark provided on the substrate 10 and the mark provided on the mold 8 using the alignment measurement equipment 6. Alternatively, the shape differences may be measured using an external apparatus of the imprint apparatus 1.

The controller 7 determines the coefficients of equations (1) and (2) so as to approximate the shape differences. The first-order components ($k_3$, $k_4$, $k_5$, and $k_6$) can be corrected by giving a first command value 21 to the mold deformation mechanism 38, and the second- or higher-order components ($k_7$, $k_8$, $k_9$, $k_{10}$, $k_{11}$, $k_{12}$, . . . ) can be corrected by giving a second command value 22 to the mold deformation mechanism 38. The second- or higher-order components may further be corrected by giving a third command value 23 to the substrate heater 43. The mold deformation mechanism 38 can be given a sum of the first command value 21 and the second command value 22 as a command value.

A method of determining the first command value 21 and the second command value 22 given to the mold deformation mechanism 38 and the third command value 23 given to the substrate heater 43 in accordance with the shape differences $T_x$ and $T_y$ will exemplarily be described below. Equations (3) and (4) below indicate deformation amounts $dx\_M_1$ to $dx\_M_m$ in the X direction and deformation amounts $dy\_M_1$ to $dy\_M_m$ in the Y direction at an evaluation point m of the mold 8 deformed by the mold deformation mechanism 38 in accordance with command values $c\_Act_1$ to $c\_Act_n$ given to the plurality of actuators 60. A matrix a is a transformation matrix for calculating the deformation amounts $dx\_M_1$ to $dx\_M_m$ in the X direction and the deformation amounts $dy\_M_1$ to $dy\_M_m$ in the Y direction at the evaluation point m of the pattern region 8a of the mold 8 from the command values $c\_Act_1$ to $c\_Act_n$ given to the actuators 60. In this example, the deformation of the pattern region 8a of the mold 8 is evaluated at the evaluation point m.

$$\begin{bmatrix} dx\_M_1 \\ \vdots \\ dx\_M_m \end{bmatrix} = \begin{bmatrix} a_{x1,1} & \cdots & a_{x1,n} \\ \vdots & \ddots & \vdots \\ a_{xm,1} & \cdots & a_{xm,n} \end{bmatrix} \begin{bmatrix} c\_Act_1 \\ \vdots \\ c\_Act_n \end{bmatrix} \quad (3)$$

$$\begin{bmatrix} dy\_M_1 \\ \vdots \\ dy\_M_m \end{bmatrix} = \begin{bmatrix} a_{y1,1} & \cdots & a_{y1,n} \\ \vdots & \ddots & \vdots \\ a_{ym,1} & \cdots & a_{ym,n} \end{bmatrix} \begin{bmatrix} c\_Act_1 \\ \vdots \\ c\_Act_n \end{bmatrix} \quad (4)$$

Equations (5) and (6) indicate deformation amounts $dx\_W_1$ to $dx\_W_m$ in the X direction and deformation amounts $dy\_W_1$ to $dy\_W_m$ in the Y direction at the evaluation point m in the shot region of the substrate 10 deformed by heat amounts $c\_Heat_1$ to $c\_Heat_p$ given to the substrate 10 by the substrate heater 43. A matrix b is a transformation matrix for calculating the deformation amount at the evaluation point m of the shot region by the heat amounts $c\_Heat_1$ to $c\_Heat_p$.

$$\begin{bmatrix} dx\_W_1 \\ \vdots \\ dx\_W_m \end{bmatrix} = \begin{bmatrix} b_{x1,1} & \cdots & b_{x1,n} \\ \vdots & \ddots & \vdots \\ b_{xm,1} & \cdots & b_{xm,n} \end{bmatrix} \begin{bmatrix} c\_Heat_1 \\ \vdots \\ c\_Heat_n \end{bmatrix} \quad (5)$$

$$\begin{bmatrix} dy\_W_1 \\ \vdots \\ dy\_W_m \end{bmatrix} = \begin{bmatrix} b_{y1,1} & \cdots & b_{y1,n} \\ \vdots & \ddots & \vdots \\ b_{ym,1} & \cdots & b_{ym,n} \end{bmatrix} \begin{bmatrix} c\_Heat_1 \\ \vdots \\ c\_Heat_n \end{bmatrix} \quad (6)$$

Correction amounts by the mold deformation mechanism 38 and the substrate heater 43 are represented by dX and dY given by:

$$dX = \begin{bmatrix} dx\_M_1 \\ \vdots \\ dx\_M_m \end{bmatrix} + \begin{bmatrix} dx\_W_1 \\ \vdots \\ dx\_W_m \end{bmatrix} \quad (7)$$

$$dY = \begin{bmatrix} dy\_M_1 \\ \vdots \\ dy\_M_m \end{bmatrix} + \begin{bmatrix} dy\_W_1 \\ \vdots \\ dy\_W_m \end{bmatrix} \quad (8)$$

The first command value 21 and the second command value 22 given to the mold deformation mechanism 38 and the third command value 23 given to the substrate heater 43 can be determined by obtaining the correction amounts dX and dY such that differences $\varepsilon_x$ and $\varepsilon_y$, in equation (9), between the shape differences $T_x$ and $T_y$ and the correction amounts dX and dY are minimized. More specifically, the first command value 21, the second command value 22, and the third command value 23 can be determined using the least squares method or the like.

$$\begin{bmatrix} \varepsilon_x \\ \varepsilon_y \end{bmatrix} = \begin{bmatrix} T_x \\ T_y \end{bmatrix} - \begin{bmatrix} dX \\ dY \end{bmatrix} \quad (9)$$

A comparative example concerning determination of the first command value 21, the second command value 22, and the third command value 23 will be described below. In the comparative example, the second command value 22 and the third command value 23 are determined first to correct the second- or higher-order components. In the comparative example, after that, the first-order components such as a magnification and a parallelogram included in the shape difference between the shot region and the pattern region are determined from a result of measurement using the alignment measurement equipment 6 during an imprint process, and a correction amount is determined for each imprint process, thereby performing correction. Therefore, in the comparative example, in a state in which the second command value 22 for correcting the second- or higher-order components is maintained, it is necessary to change the first command value 21 for each imprint process. Furthermore, in the comparative example, a restriction is imposed so that the sum of the first command value 21 and the second command value 22 does not exceed the limit value of a command value to the actuator 60.

Figure 10:
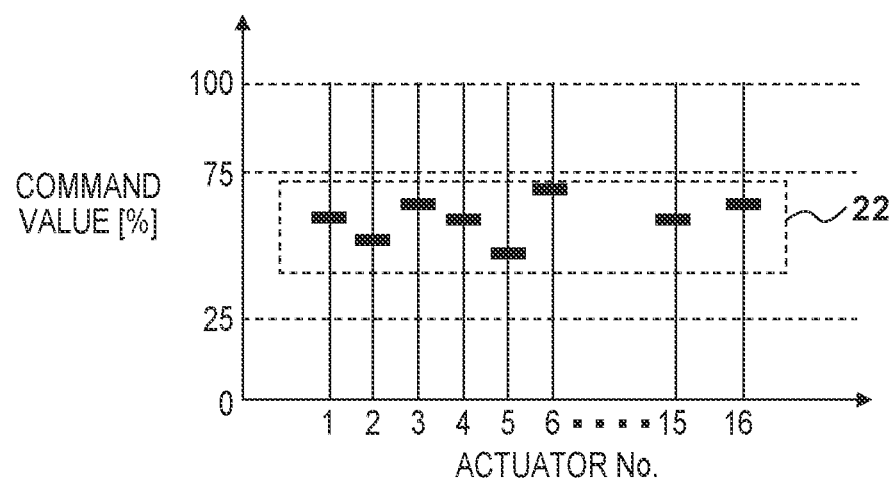
FIG. 10 is a view showing an example of assignment of command values in a comparative example.

If the command value given to the actuator 60 reaches the limit value, the balance of the force for pressing the mold 8 from every direction may be lost, and the mold 8 held by the mold holder 11 may be displaced. For example, a half of the range of the command value (to be referred to as the range of an allowable command value hereinafter) that can be given to the actuator 60 is assigned to each of the first command value 21 and the second command value 22 as a restriction so the command value given to the actuator 60 does not exceed the limit value. FIG. 10 shows an example. In the example shown in FIG. 10, the second command value 22 is assigned with 25% to 75% of the minimum (0%) to the maximum (100%) of the range of the allowable command value of the actuator 60 to correct the second- or higher-order components. Furthermore, the first command value 21 is assigned with 0% to 25% and 75% to 100% of the minimum to the maximum of the range of the allowable command value of the actuator 60 to correct the first-order components. This indicates that the range of the second command value 22 is −25% to +25% and the range of the first command value 21 is similarly −25% to +25% when focusing on 50% of the range of the allowable command value of the actuator 60. This can perform an operation without exceeding the limit value of the range of the allowable command value by the command value given to the actuator 60. However, if the use ranges of the first command value 21 and the second command value 22 are clearly separated, for example, even if the first command value 21 has a margin, the margin cannot be given to the second command value 22.

To solve the above problem in the comparative example, this embodiment to be described below effectively distributes, to the first command value 21 and the second command value 22, a force that can be generated by the actuators 60, thereby improving the overlay accuracy.

Figure 4:
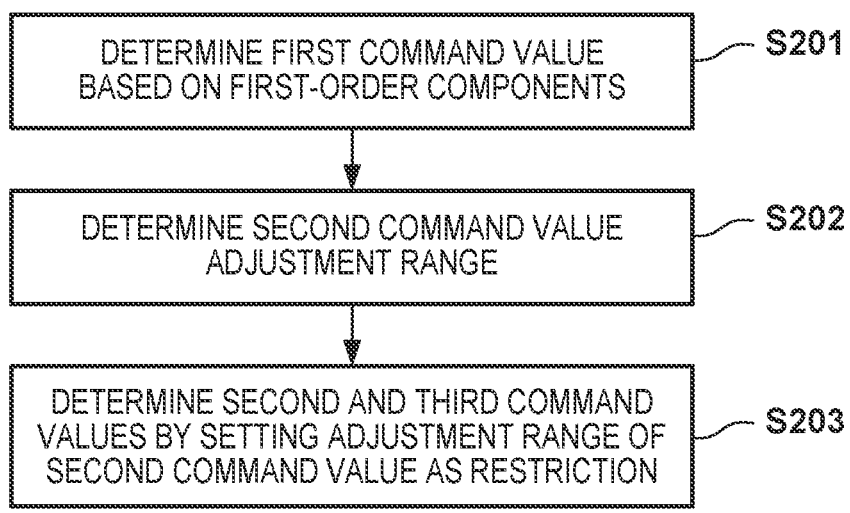
FIG. 4 is a flowchart illustrating a processing procedure of determining command values to be given to the mold deformation mechanism and the substrate heater.

FIG. 4 shows a processing procedure of determining the command values given to the mold deformation mechanism 38 and the substrate heater 43. This processing is executed by the controller 7. The controller 7 may be formed as an information processing apparatus that generates information for controlling the imprint apparatus 1. In step S201, the controller 7 measures the shape difference between the shot region of the substrate 10 and the pattern region 8a of the mold 8 using the alignment measurement equipment 6, and determines first-order components such as magnification components and rhombic components in the shape difference. Then, the controller 7 determines, for each of the plurality of actuators 60, the first command value 21 to be given to the actuator 60 of the mold deformation mechanism 38 in order to correct the first-order components. Measurement of the shape difference between the shot region of the substrate 10 and the pattern region 8a of the mold 8 using the alignment measurement equipment 6 can be performed in a state in which the imprint material 14 on the shot region is in contact with the pattern region 8a of the mold 8. The first command value 21 to be given to the mold deformation mechanism 38 can be determined by determining the correction amounts dX and dY that minimize the differences $\varepsilon_x$ and $\varepsilon_y$ of equation (9) for equations obtained by excluding equations (5) and (6) from equations (7) and (8).

In step S201, the controller 7 determines the first command value 21 to be given to each actuator 60 so as to fall within the range of the allowable command value of each of the plurality of actuators 60 of the mold deformation mechanism 38. The first command value 21 determined by the controller 7 can take an arbitrary value belonging to the range of the allowable command value (any value belonging to the range of the allowable command value).

Figure 5A:
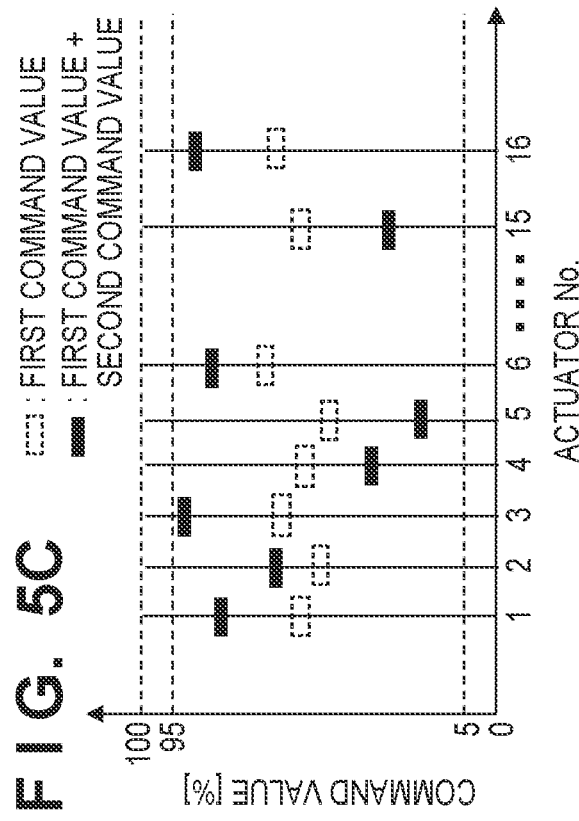
FIGS. 5A to 5D are views for exemplarily explaining processing of determining the second command value to be given to the mold deformation mechanism and the third command value to be given to the substrate heater in order to correct second- or higher-order components (a component of $k_7$ and subsequent components)

Processing (steps S202 and S203) of determining the second command value to be given to the mold deformation mechanism 38 and the third command value to be given to the substrate heater 43 in order to correct the second- or higher-order components (the component of $k_7$ and the subsequent components) will be exemplarily described next with reference to FIGS. 5A to 5D. For example, a command value of 100% on the ordinal axis shown in FIG. 5A is the limit value (upper limit value) of the range of the allowable command value of each actuator 60. Since a command value exceeding this limit value cannot be given to the actuator 60 (or it is meaningless to give such command value), it is necessary to determine the second command value 22 to be equal to or smaller than the limit value.

In actual device manufacturing, the first-order components of the shapes (or the shape difference between the shapes of the plurality of shot regions and the pattern region 8a) of the plurality of shot regions of the substrate 10 may vary. Thus, if the process is adjusted to give an arbitrary command value such that the sum of the first and second command values falls within the range of the allowable command value, when the first-order components vary, it may be impossible to make the sum of the first and second command values fall within the range of the allowable command value.

Figure 5C:
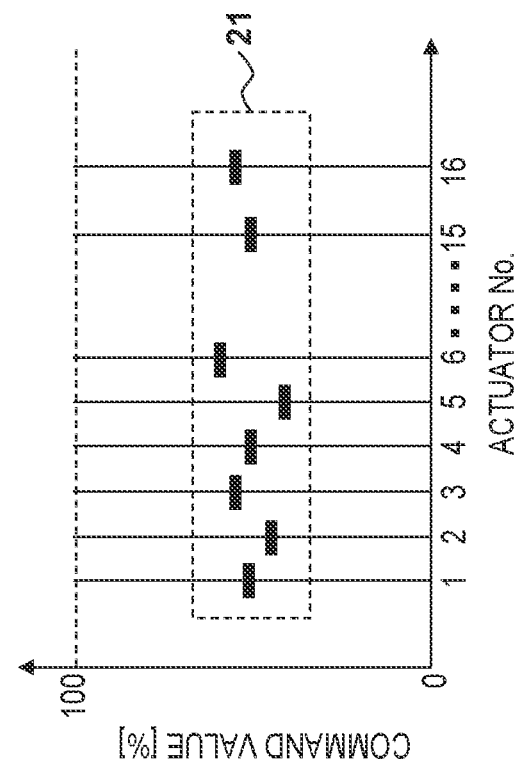
Figure 5B:
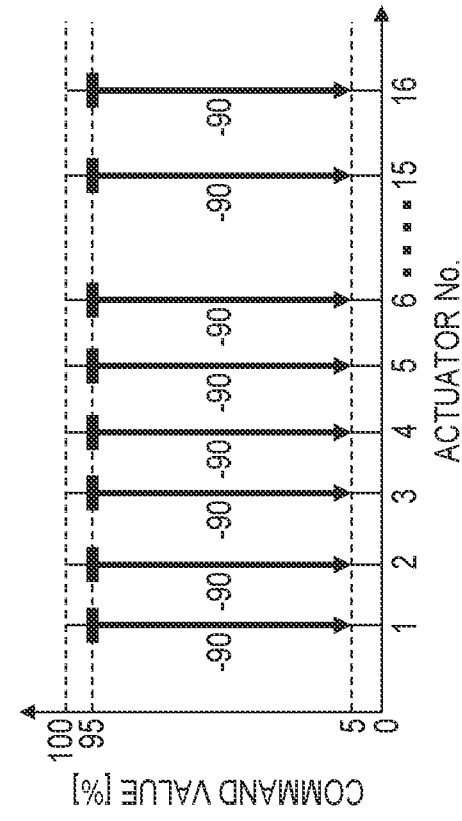

To cope with the variations of the first-order components, there can be provided the first margin (command value=0% to 5%) for adjusting the first command value 21 to a smaller value and a second margin (command value=95% to 100%) for adjusting the first command value 21 to a larger value, as shown in FIG. 5B. If the process is stable, the margins can be made small, and can ultimately be set to 0, as a matter of course.

In step S202, the controller 7 determines the adjustment range of the second command value 22 based on the first command value 21 and the remaining adjustment range obtained by excluding the first and second margins from the range of the allowable command value. If the first and second margins are 0, the remaining adjustment range matches the allowable adjustment range; otherwise, the remaining adjustment range is narrower than the allowable adjustment range. For example, in the example shown in FIG. 5B, for the actuator 60 of No. 1, the first command value 21 is 55%, and thus the controller 7 determines a range of +40% to −50% as the adjustment range of the second command value 22. In other words, the controller 7 determines the adjustment range of the second command value 22 so that the sum of the first command value 21 and the second command value 22 falls within the remaining adjustment range (a range of 5% to 95%). Similarly, for the actuator 60 of No. 2, the first command value 21 is 50%, and thus the controller 7 determines a range of +45% to −45% as the adjustment range of the second command value 22. In other words, the controller 7 determines the adjustment range of the second command value 22 so that the sum of the first command value 21 and the second command value 22 falls within the remaining adjustment range (a range of 5% to 95%).

Figure 5D:
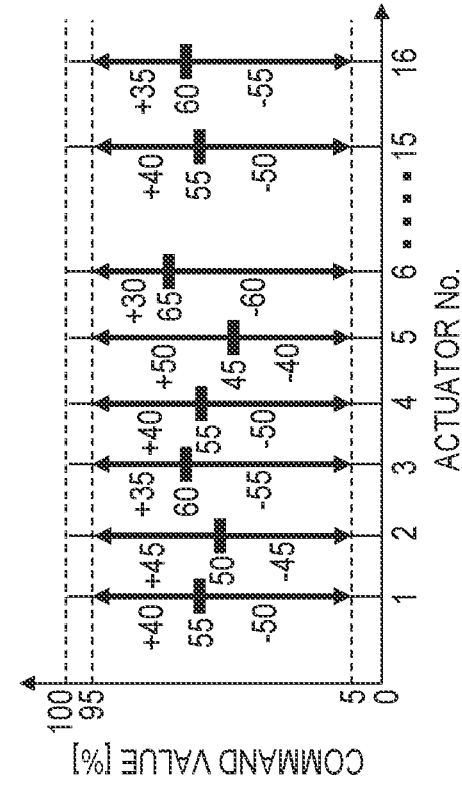

FIG. 5D shows an extreme example for deep understanding. In the example shown in FIG. 5D, for all the actuators 60, 95% is determined as the first command value 21. In this case, for all the actuators 60, the second command value 22 can be determined within the adjustment range of +0% to −90%. In the comparative example, the use ranges of the first command value 21 and the second command value 22 are determined in advance. In this embodiment, however, since the use range of the second command value 22 is determined in accordance with the first command value 21, the actuators 60 can be used efficiently.

In step S203, for the plurality of actuators 60, the controller 7 determines the second command value 22 and the third command value 23 by setting the adjustment range of the second command value 22 as a restriction of $c\_Act_1$ to $c\_Act_n$ of equations (3) and (4), and calculating the correction amounts dX and dY of equation (9). FIG. 5C exemplifies the first command value 21 and the second command value 22 determined for each actuator 60 in this way. As described above, if the first and second margins are 0, the remaining adjustment range matches the allowable adjustment range; otherwise, the remaining adjustment range is narrower than the allowable adjustment range. Therefore, it can be said that the controller 7 determines the second command value 22 so that the sum of the first command value 21 and the second command value 22 falls within the range of the allowable command value or a range narrower than the range of the allowable command value.

Steps S201, S202, and S203 can be executed based on the shape difference between the pattern region 8a and each shot region SR obtained using the alignment measurement equipment 6 when executing the imprint process for each shot region SR of the substrate 10 in the imprint apparatus 1. Alternatively, a result obtained by executing the imprint process while controlling the mold deformation mechanism 38 in accordance with the first command value determined in step S201 may be evaluated, and steps S202 and S203 may be executed based on an evaluation result, thereby determining the second and third command values.

Figure 6:
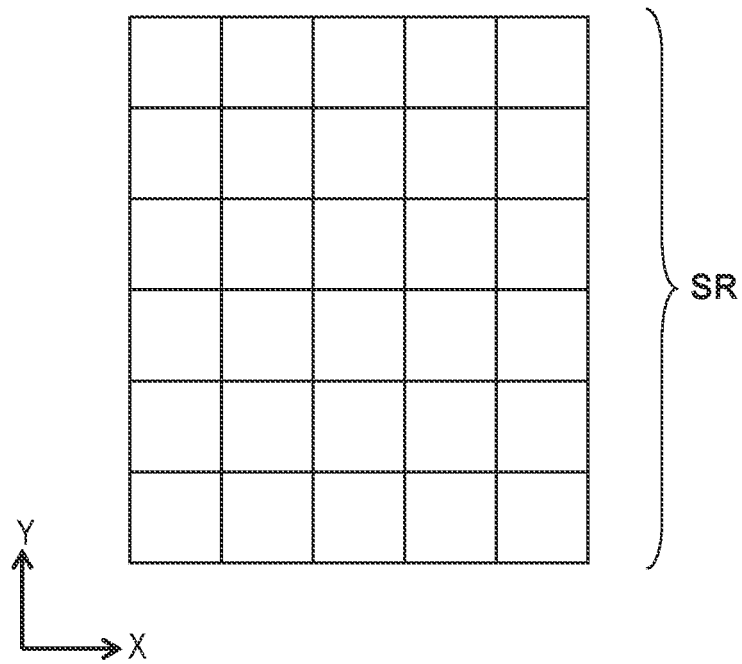
FIG. 6 is a view for exemplarily explaining a method of controlling the shape of one shot region of a substrate by dividing the shot region into a plurality of element regions.

The third command value 23 will be described with reference to FIG. 6. As exemplified in FIG. 6, the shot region SR of the substrate 10 is divided into a plurality of element regions, and the third command value 23 is determined, for each element region, as a command value for commanding a heating amount. In FIG. 6, for the sake of simplicity, the shot region SR is divided into five parts in the X direction, and divided into six parts in the Y direction. The divided regions can be determined in accordance with necessary overlay accuracy and the like.

Figure 7:
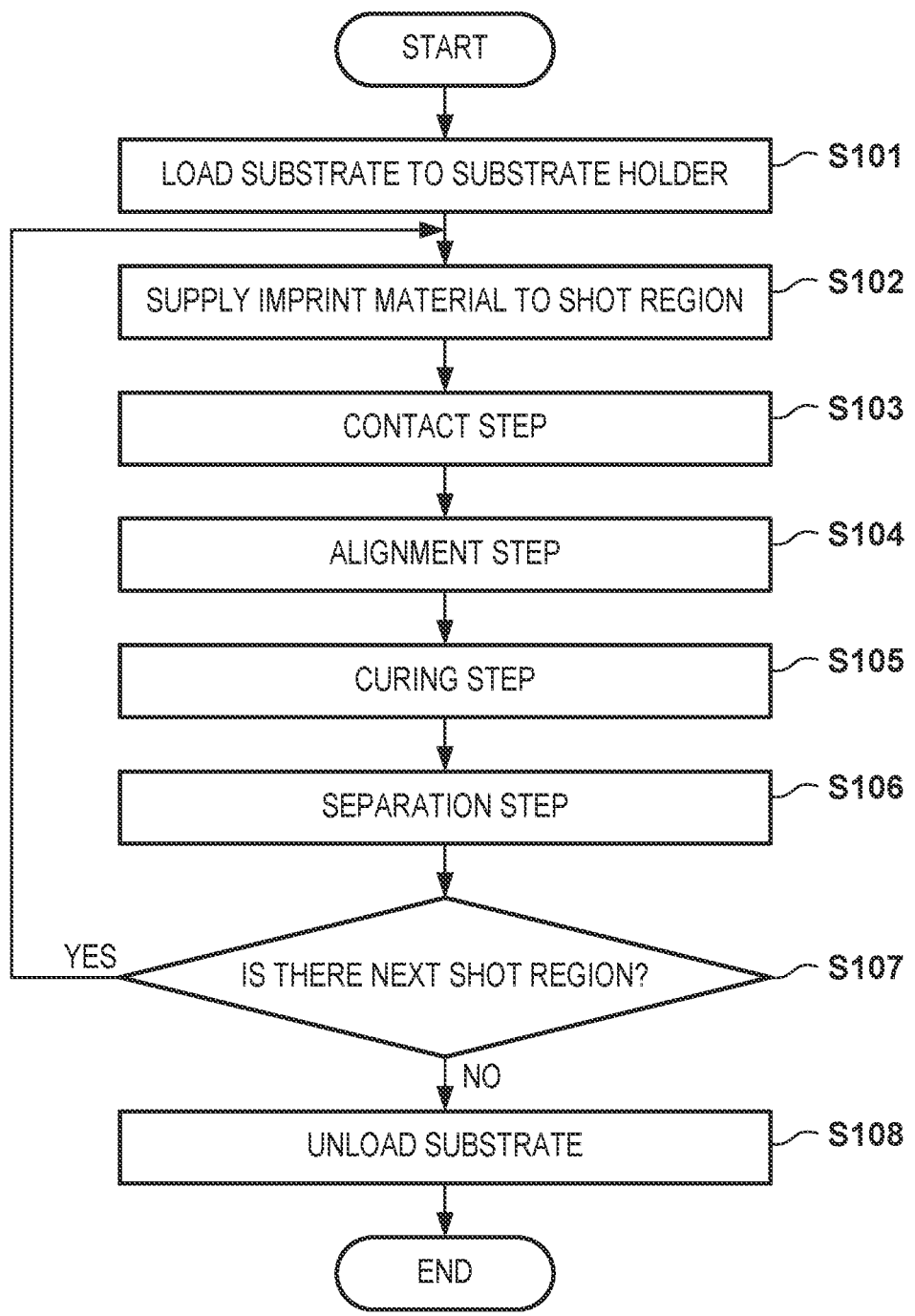
FIG. 7 is a flowchart illustrating an example of the operation of the imprint apparatus.

FIG. 7 exemplifies the operation of the imprint apparatus 1. This operation is controlled by the controller 7. Two operation examples will be described below with reference to FIG. 7.

The first operation example will be described first. In the first operation example, in an alignment step, the controller 7 determines the first, second, and third command values. In step S101, the substrate 10 is loaded to the substrate holder 16. In step S102, the dispenser 5 supplies the imprint material 14 to the shot region of the substrate 10. In step S103, the mold driving mechanism 12 drives the mold 8 downward so as to bring the pattern region 8a of the mold 8 into contact with the imprint material 14 on the shot region. In step S104, the relative position between the mark on the substrate 10 and the mark on the mold 8 is measured using the alignment measurement equipment 6, and the shot region and the pattern region 8a are aligned based on the result of the measurement. In the alignment, the first, second, and third command values for reducing the shape difference between the shot region and the pattern region 8a are determined, and the mold deformation mechanism 38 and the substrate heater 43 are controlled in accordance with the command values, thereby reducing the shape difference. As described above, the controller 7 determines the second command value so that the sum of the first and second command values falls within the range of the allowable command value or a range narrower than the range of the allowable command value. This can be understood as an operation of determining the adjustment range of the second command value based on the first command value, and determining the second command value by setting the adjustment range as a restriction.

In step S105, the light irradiator 2 irradiates the imprint material 14 between the shot region and the pattern region 8a of the mold 8 with curing light, thereby curing the imprint material 14. This forms a pattern made of the cured product of the imprint material 14 on the shot region. In step S106, the mold driving mechanism 12 drives the mold 8 upward so as to separate the pattern region 8a of the mold 8 from the cured product of the imprint material 14 on the shot region. In step S107, it is determined whether there is a next shot region (another shot region to be processed). If there is the next shot region, the process returns to step S102, and the same processing is performed for the next shot region. On the other hand, if there is no next shot region, the process advances to step S108, and the substrate 10 is unloaded from the substrate holder 16.

The second operation example will be described next. In the second operation example, in the alignment step S104, the first command value is determined and the second and third command values are set to 0, thereby performing alignment. After that, the curing step S105 and the separation step S106 are performed. Then, the second and third command values are determined based on a result of measuring the pattern thus formed on the shot region by the alignment measurement equipment 6 or an external apparatus. As described above, the controller 7 determines the second command value so that the sum of the first and second command values falls within the range of the allowable command value or a range narrower than the range of the allowable command value. This can be understood as an operation of determining the adjustment range of the second command value based on the first command value, and determining the second command value based on the result of measuring the pattern formed on the shot region by the alignment measurement equipment 6 or the external apparatus. This determines the first, second, and third command values, and then the operation shown in FIG. 7 can be executed for another substrate. At this time, in the alignment step S104, only the first command value that can be influenced by the variations of the first-order components. As for the second and third command values, the already determined second and third command values can be used. Alternatively, if the variations of the first-order components are small, the already determined first, second, and third command values can be used as the first, second, and third command values in the alignment step S104.

Figure 8:
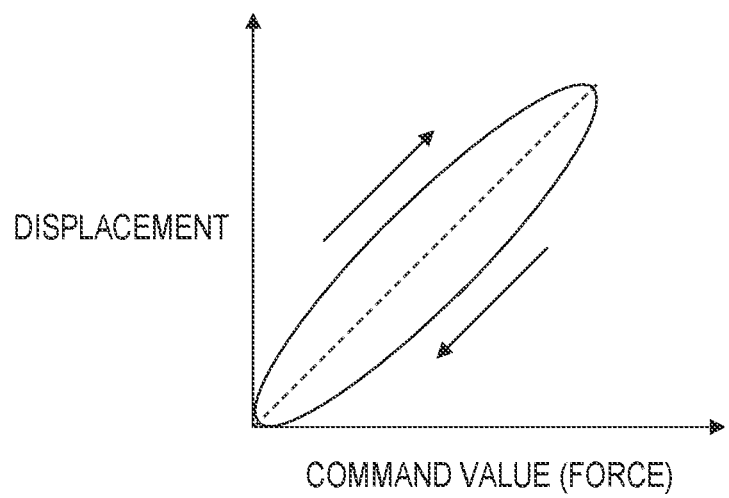
FIG. 8 is a graph for explaining a hysteresis in the relationship between a command value given to an actuator of the mold deformation mechanism and the displacement of a given point of the mold.

A modification of the above-described embodiment will be described below. Matters that are not mentioned as the modification can comply with the above-described embodiment. In the modification, the mold holder 11 holds the mold 8 by vacuum suction. Therefore, when deforming the mold 8 by the actuators 60 of the mold deformation mechanism 38, friction is generated at the contact surface between the mold 8 and the mold holder 11. FIG. 8 exemplifies the displacement (deformation amount) of a given point of the mold 8. In FIG. 8, the abscissa represents the command value to the actuator 60 and the ordinate represents the displacement of the given point of the mold 8. If there is no friction, the command value and the displacement have a proportional relationship, and when the command value is increased/decreased, the displacement linearly changes (a dotted line in FIG. 8). However, if there is friction, a hysteresis occurs in the relationship between the command value and the displacement, and the locus of the displacement is different between a case in which the command value is increased and a case in which the command value is decreased.

This modification provides a technique of reducing an overlay error that may occur due to friction generated at the contact surface between the mold 8 and the mold holder 11. If a hysteresis occurs in the relationship between the command value to the actuator 60 and the deformation amount of the pattern region 8a of the mold 8, shape correction is not performed correctly by the mold deformation mechanism 38, and an overlay error between the pattern region 8a and the shot region SR of the substrate 10 may become large. When the shape of the pattern region 8a of the mold 8 is made to conform to the shape of the shot region SR of the substrate 10 by the mold deformation mechanism 38, directions are unified into a direction in which the command value to the actuator 60 is increased or decreased. This can prevent the error caused by the hysteresis.

Figure 9:
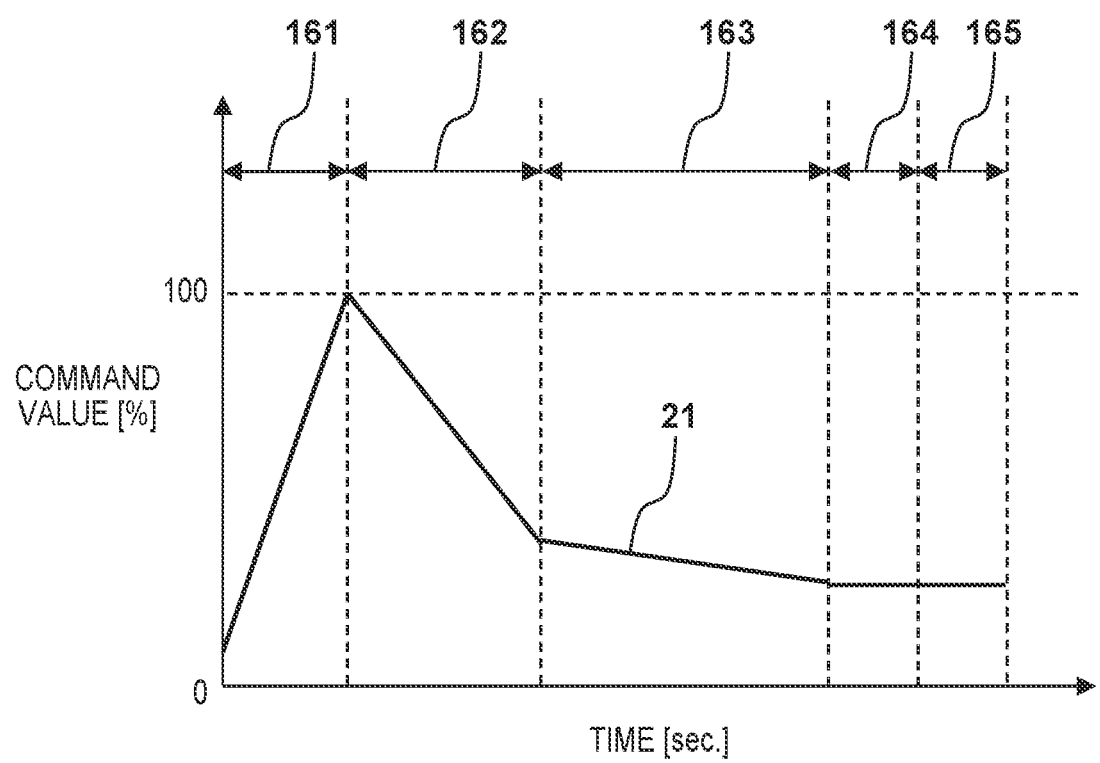
FIG. 9 is a timing chart exemplifying a representative time-series change of a command value to actuators.

FIG. 9 exemplifies a representative time-series change of the command value to the actuators 60. The abscissa represents time, and the ordinate represents the command value to the actuators 60. Before the alignment step in FIG. 7, for example, a maximum command value is given to all the actuators 60 of the mold deformation mechanism 38 simultaneously with step S102, thereby pressing the side surfaces of the mold 8 with a maximum force. A first section 161 shown in FIG. 9 corresponds to this. In a second section 162, the controller 7 sends, as a command value, the sum of the first command value 21 and the second command value 22 to the mold deformation mechanism 38, thereby driving the actuators 60. In a third section 163, the alignment measurement equipment 6 measures the first-order components of the shape difference between the shot region SR and the pattern region 8a. Based on a result, the controller 7 updates the first command value 21, and also updates the command value as the sum of the first command value 21 and the second command value 22, thereby sending the command value to the actuators 60. The second section 162 and the third section 163 correspond to the alignment step S104. In a fourth section 164, alignment between the shot region SR of the substrate 10 and the pattern region 8a of the mold 8 ends, thereby curing the imprint material 14. In a fifth section 165, the mold 8 is separated from the cured imprint material 14. The fourth section 164 and the fifth section 165 correspond to the curing step S105 and the separation step S106.

In the above example, in the second section 162 and the third section 163, the shape of the pattern region 8a is corrected in accordance with the shot region SR of the substrate 10 in the direction in which the command value to the actuators 60 is decreased. Conversely, in the second section 162 and the third section 163, the shape of the pattern region 8a may be corrected in accordance with the shot region SR of the substrate 10 in the direction in which the command value to the actuators 60 is increased.

The pattern of a cured product formed using an imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

Figure 11A:
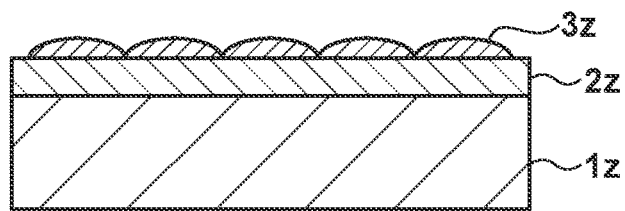
FIGS. 11A to 11F are views exemplifying an article manufacturing method.

An article manufacturing method in which an imprint apparatus forms a pattern on a substrate, processes the substrate on which the pattern is formed, and manufactures an article from the processed substrate will be described next. As shown FIG. 11A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 11B:
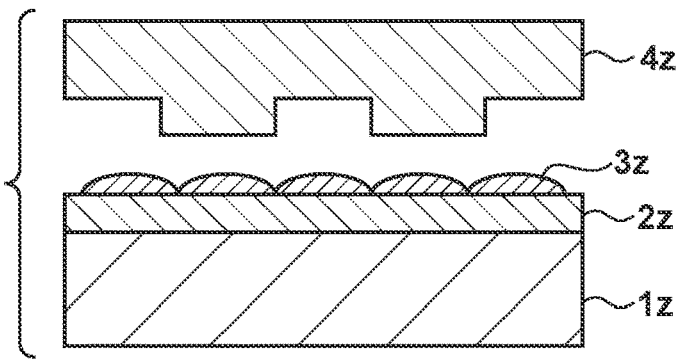
Figure 11C:
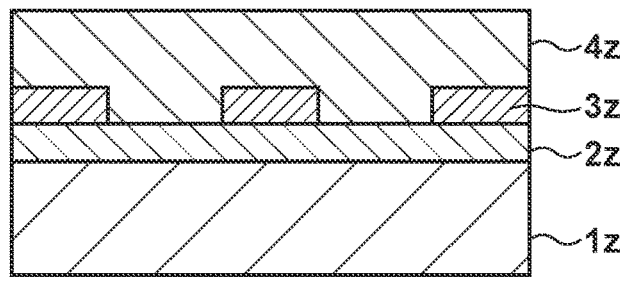

As shown in FIG. 11B, a side of a mold 4z for imprint with a concave-convex pattern is directed toward and made to face the imprint material 3z on the substrate. As shown FIG. 11C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 11D:
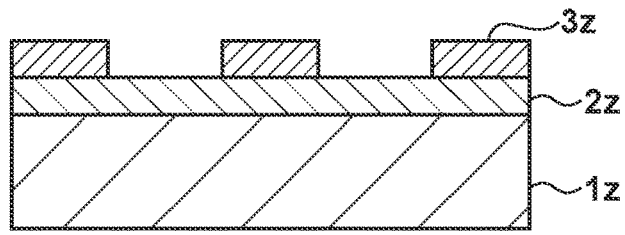

As shown in FIG. 11D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 11E:
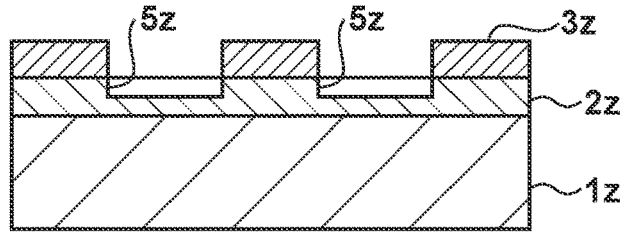
Figure 11F:
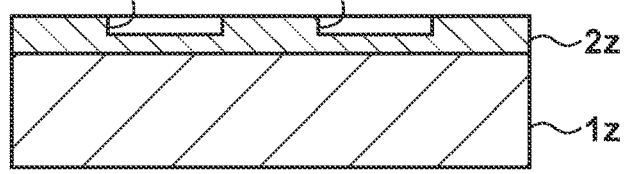

As shown in FIG. 11E, when etching is performed using the pattern of the cured product as an etching resistant mask, a portion of the surface of the processed material 2z where the cured product does not exist or remains thin is removed to form a groove 5z. As shown in FIG. 11F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-091617, filed May 14, 2019, which is hereby incorporated by reference herein in its entirety.

What is claimed is:

1. An imprint apparatus for forming a pattern to an imprint material by bringing a pattern region of a mold into contact with the imprint material on a shot region of a substrate comprising:
   a plurality of actuators configured to control a shape of the pattern region by applying a force to the mold;
   an alignment measurement equipment configured to measure a relative position between a mark on the substrate and a mark on the mold; and
   a controller configured to control the plurality of actuators so as to apply the force to the mold based on command values corresponding to respective ones of the plurality of actuators, each of the command values being determined to have a value within an allowable command range for a corresponding one of the plurality of actuators based on:
   (a) a first command value for correcting a component that is approximated by a linear function, and
   (b) a second command value for correcting a component that is approximated by a second- or higher-order function,
   wherein the controller is configured to perform the following operations of:
   specifying the first command value for each of the plurality of actuators, based on a shape difference between the shot region and the pattern region determined from the relative position measured by the alignment measurement equipment, such that a shape difference between the shot region and the pattern region to be controlled by the plurality of actuators in accordance with the first command values decreases, then
   determining for each of the plurality of actuators, an adjustment range of the second command value based on the specified first command value, the allowable command range and a margin for adjusting the first command value, then
   determining for each of the plurality of actuators, the second command value such that a shape difference between the shot region and the pattern region to be controlled by the plurality of actuators in accordance with the command values decreases while the second command value falls within the adjustment range of the second command value, then
   determining for each of the plurality of actuators, the command value based on the first command value and the second command value, and
   controlling each of the plurality of actuators to apply the force to the mold based on the command value.

2. The apparatus according to claim 1, further comprising a substrate heater configured to control a shape of the shot region by applying heat to the substrate,
   wherein the controller determines a third command value to be given to the substrate heater so that the shape difference becomes small.

3. The apparatus according to claim 2, wherein after determining the first command value, the controller determines the adjustment range of the second command value for each of the plurality of actuators based on the first command value for each of the plurality of actuators, and determines the second command value and the third command value for each of the plurality of actuators by setting the adjustment range as a restriction.

4. The apparatus according to claim 1, wherein the first command value is determined so as to fall within upper and lower limits of the allowable command range, and takes an arbitrary value belonging to the allowable command range.

5. The apparatus according to claim 1, wherein the component that is approximated by the linear function includes at least one of a magnification component, a rotation component, and a rhombic component.

6. An imprint apparatus for forming a pattern to an imprint material by bringing a pattern region of a mold into contact with the imprint material on a shot region of a substrate comprising:
   a mold deformation mechanism configured to deform a shape of the pattern region by applying a force to the mold; and
   a controller configured to control the mold deformation mechanism so as to apply the force to the mold based on command values corresponding to the mold deformation mechanism, each of the command values being determined to have a value within an allowable command range for the mold deformation mechanism based on:
   (a) a first command value for correcting a component that is approximated by a linear function, and
   (b) a second command value for correcting a component that is approximated by a second- or higher-order function,
   wherein the controller is configured to perform the following operations of:
   specifying the first command value for the mold deformation mechanism, based on a shape difference between the shot region and the pattern region determined from the relative position measured by an alignment measurement equipment, such that a shape difference between the shot region and the pattern region in accordance with the first command values decreases, then determining an adjustment range of the second command value based on the specified first command value, the allowable command range and a margin for adjusting the first command value, then determining the second command value such that a shape difference between the shot region and the pattern region to be controlled by the mold deformation mechanism in accordance with the command values decreases while the second command value falls within the adjustment range of the second command value, then determining the command value based on the first command value and the second command value, and controlling the mold deformation mechanism to apply the force to the mold based on the command value.

\* \* \* \* \*